United States Patent [19]

Morisot et al.

[11] Patent Number: 4,486,621

[45] Date of Patent: Dec. 4, 1984

[54] HOUSING FOR A COAXIAL DIRECTIONAL COUPLER

[75] Inventors: Bernard Morisot, Paris; Michel Taton, Asnières, both of France

[73] Assignee: Les Cables De Lyon, Clichy, France

[21] Appl. No.: 376,865

[22] Filed: May 10, 1982

[30] Foreign Application Priority Data

May 8, 1981 [FR] France ................................ 81 09176

[51] Int. Cl.[3] ............................................... H05K 5/00

[52] U.S. Cl. .................................... 174/50; 174/52 R

[58] Field of Search ............... 174/50, 52 R, 53, 35 R; 333/109, 115; 334/85; 220/3.92, 3.94, 4 R; 361/424

[56] References Cited

U.S. PATENT DOCUMENTS

| | | | |
|---|---|---|---|
| 1,379,196 | 5/1921 | Lowenhaupt et al. . | |
| 1,534,723 | 4/1925 | Lewis | 220/3.94 |
| 2,590,804 | 3/1952 | Vitale | 174/52 R |
| 2,881,940 | 4/1959 | Hamilton | 220/3.94 |
| 3,237,130 | 2/1966 | Cohn . | |
| 3,369,071 | 2/1968 | Tuisku | 174/65 R |
| 3,851,226 | 11/1974 | Chen | 174/53 |
| 3,860,139 | 1/1975 | French et al. | 174/53 X |

FOREIGN PATENT DOCUMENTS 1398848 6/1975 United Kingdom .

*Primary Examiner*—John F. Gonzales
*Assistant Examiner*—D. A. Tone
*Attorney, Agent, or Firm*—Sughrue, Mion, Zinn, Macpeak and Seas

[57] ABSTRACT

A housing for a coaxial directional coupler has a channel-section body (20), each of the flanges of said channel-section body having two openings (2) with the opening in each flange being opposite to the corresponding opening in the other flange. A cover (5) is capable of closing the open space between the rims of said housing body flanges, as well as two end pieces (8) for closing the ends of the assembly formed by the channel-section body of the housing (20) and the cover (5). The invention is used in strip lines, insertion boxes, attenuators, housings for micro-electronic equipement, hybrid circuits and the like.

2 Claims, 2 Drawing Figures

HOUSING FOR A COAXIAL DIRECTIONAL COUPLER

The present invention relates to a housing for a coaxial directional coupler in particular for use at frequencies which lie between 30 $MH_z$ and 18 $GH_z$.

BACKGROUND OF THE INVENTION

Known housings are generally of complicated structure including, in particular, numerous screw fixings via which current tends to leak at high frequencies.

Further, they have cavities which are costly because they must be precision machined.

Further, designing a coupler housing for matching to ribbon wave guides as a function of frequency proves to be complicated in each particular case.

The present invention mitigates the abov.e-outlined disadvantages.

SUMMARY OF THE INVENTION

The invention provides a housing for a coaxial directional coupler, said housing comprising a channel-section housing body each of the flanges of said channel-section havin two openings, with the openings in each flange being opposite to the corresponding openings in the other flange, a cover suitable for closing the gap between the rims of the flanges, and two end pieces to close the ends of the assembly formed by the housing body and the cover.

BRIEF DESCRIPTION OF THE DRAWINGS

Other features and advantages of the invention become apparent from the following description given with reference to the accompanying drawings in which.

MORE DETAILED DESCRIPTION

Figure 1:
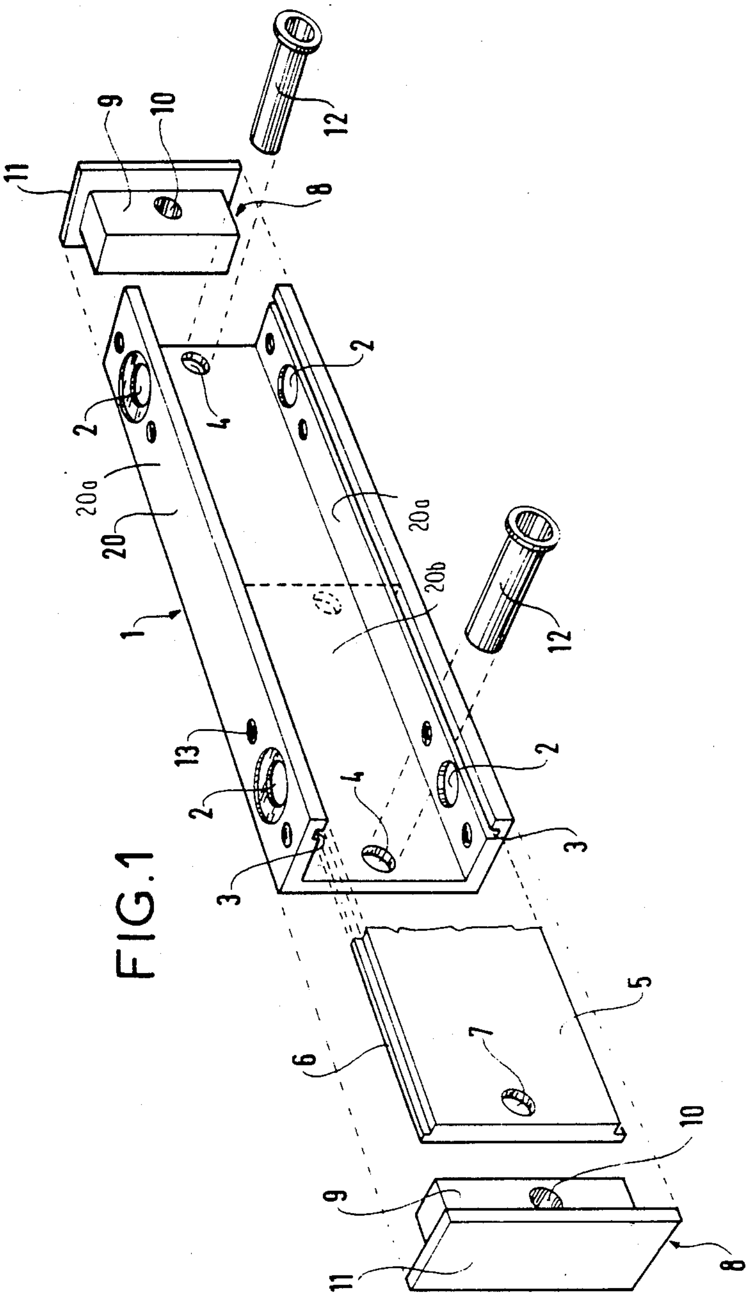
FIG. 1 is a perspective exploded view of the components which constitute the coupler housing in accordance with the invention.

Referring to FIG. 1, a housing 1 in accordance with the invention for a coaxial directional coupler has a body 20 of channel shaped cross-section including flanges 20*a* . Each of the flanges of the channel has two openings 2 near respective ends, the openings in each flange being opposite corresponding openings in the other. A groove 3 runs along the inside of each flange 20*a* between the openings 2 and the edge of the flange.

Further, two bores 4 are provided at the ends of web 20*b* of the body 20.

A cover 5 has tongues 6 at opposed edges, capable of engaging in the grooves 3 in the body of the housing 20 and bores 7 provided at its ends to come opposite to bores 4 in web 20*b* of the channel-shaped body of the housing 20 when the cover 5 is in place thereon.

Two end pieces 8 are designed to close the ends of the assembly formed by the body of the housing and its cover. Each of these end pieces has a body 9, with a bore 10 drilled therethrough, it being possible to insert said end between the body of the housing 20 and the cover 5, and a rim 11 which presses against said assembly. Said bores 10 are disposed adjacent the bores 4 and 7 respectively in body of the housing 20 and the adjacent cover 5.

The set of previously described components is clamped together by means of tubular pins 12 inserted in the bores 4, 7 and 10 provided through the components of the housing.

Figure 2:
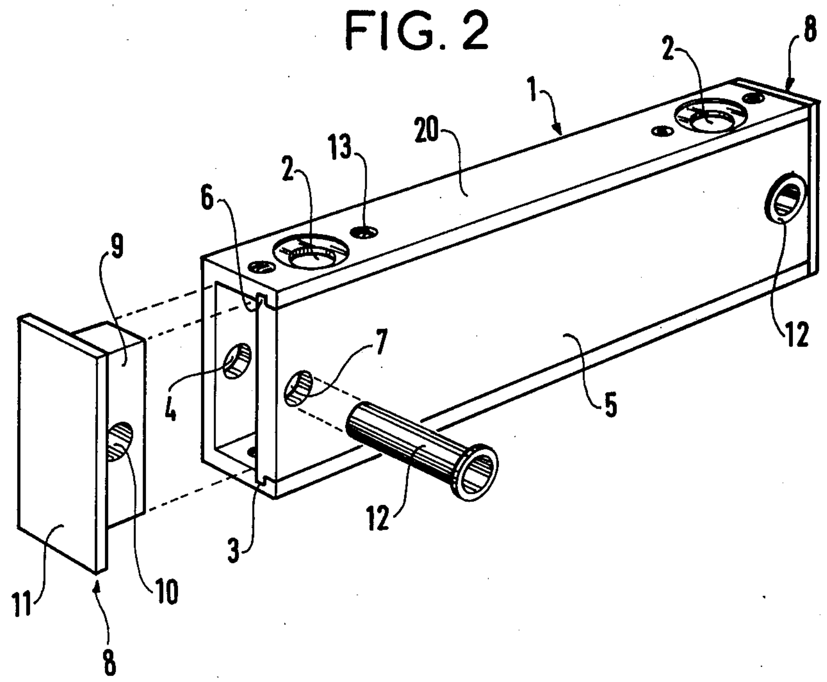
FIG. 2 illustrates said components assembled together to form the housing for the coupler in accordance with the invention.

FIG. 2 illustrates the assembled housing.

In a known way, each opening 2 is coupled to a connector and is fixed thereto by screws or other fixing means passing through small holes 13 diposed on either side of each opening 2.

The apparatus in accordance with the invention is mechanically very simple and electric losses are thereby reduced to a minimum.

Further, it reduces design time necessary to devise a given coupling.

Also, its cost price is particularly low-about one sixth of that of housings for conventional couplers.

Advantageous applications are found for the housing in strip lines, insertion boxes, attenuators, housings for micro-electronic equipment, hybrid circuits and the like.

We claim:

1. A housing for a coaxial directional coupler, said housing comprising a channel-section housing body forming opposed flanges, each of said flanges of said channel-section body terminating in rims and having two openings, with the openings in one flange being opposite to the corresponding openings in the other flange, a cover having tongues, matching grooves for said tongues provided within said flanges near the rim of each flange, and facing each other, said cover closing the gap between the rims of the flanges, and two end pieces closing the ends of the assembly formed by the housing body and the cover, each of said end pieces comprising a body inserted between the channel-section housing body and said cover, and a rim which presses against the ends of the housing body and said cover.

2. A housing according to claim 1, wherein said housing includes a web extending between and joining said flanges, and wherein at the end of the housing, the web of the body, the cover and each end piece is provided with aligned bores, and wherein said housing further comprises tubular pins inserted in said aligned bores through said cover, said end pieces and said body web and constituting clamping means for clamping said components into a compact assembly.

* * * * *